United States Patent [19]

Gerston et al.

[11] Patent Number: 5,541,580

[45] Date of Patent: Jul. 30, 1996

[54] BODY DETECTOR

[75] Inventors: Charles Gerston, Scottsdale; Thomas M. Fox, Gilbert, both of Ariz.

[73] Assignee: Motorola, Inc., Schaumburg, Ill.

[21] Appl. No.: 512,985

[22] Filed: Aug. 9, 1995

Related U.S. Application Data

[63] Continuation of Ser. No. 154,369, Nov. 18, 1993, abandoned.

[51] Int. Cl.$^6$ ..................................................... G08B 23/00
[52] U.S. Cl. ........................... 340/573; 340/539; 324/672
[58] Field of Search .................................. 340/573, 539; 324/663, 678, 672–677, 681

[56] References Cited

U.S. PATENT DOCUMENTS

| | | | |
|---|---|---|---|
| 2,950,436 | 8/1960 | Butticaz et al. | 324/672 |
| 3,478,344 | 11/1969 | Schwitzgebel et al. | 340/312 |
| 3,774,237 | 11/1973 | Hardway, Jr. | 324/672 |
| 4,114,090 | 9/1978 | Poshitt | 324/677 |
| 4,173,892 | 11/1979 | Khurgin | 361/289 |
| 4,303,073 | 12/1981 | Archibald | 128/303.13 |
| 4,470,300 | 9/1984 | Kobayaski | 324/681 |
| 4,532,501 | 7/1985 | Hoffman | 340/573 |
| 4,885,571 | 12/1989 | Pauley et al. | 340/573 |
| 4,918,432 | 4/1990 | Pauley et al. | 340/573 |
| 4,952,913 | 8/1990 | Pauley et al. | 340/573 |
| 4,952,928 | 8/1990 | Carroll et al. | 340/825 |
| 4,965,523 | 10/1990 | Baker et al. | 324/672 |
| 5,032,823 | 7/1991 | Bower et al. | 340/568 |
| 5,045,839 | 9/1991 | Ellis et al. | 340/539 |
| 5,075,670 | 12/1991 | Bower et al. | 340/573 |
| 5,089,783 | 2/1992 | Kapsokavathis et al. | 324/672 |
| 5,189,395 | 2/1993 | Mitchell | 340/539 |
| 5,204,670 | 4/1993 | Stinton | 340/825.54 |
| 5,235,319 | 8/1993 | Hill et al. | 340/573 |
| 5,256,975 | 10/1993 | Mellitz et al. | 324/672 |

FOREIGN PATENT DOCUMENTS

| | | |
|---|---|---|
| 0086097 | 2/1983 | European Pat. Off. . |
| 8902635 | 3/1989 | WIPO ............. G08B 29/00 |

Primary Examiner—Michael Horabik
Assistant Examiner—Michael Day
Attorney, Agent, or Firm—Frederick M. Fliegel

[57] ABSTRACT

A body detector (10) detects when a body (12) is absent from a region (26) being monitored. The body (12) has a different dielectric constant than air. The region (26) is configured as a capacitor (20) in which the body (12), if present, serves as a dielectric. The capacitance of the capacitor (20) is measured (28). This measurement influences a baseline value (30). The capacitance is measured (38) a second time. The second measurement is checked to verify that it is within minimum (42) and maximum (46) values. In addition, it is checked to verify that it is within a more narrow range (54) that is defined in response to the baseline value. The second measurement is then used to adjust the baseline value and the process repeats. The range (54) within which the capacitance must stay slowly adapts to changes in the capacitance of the capacitor (20). Abrupt changes in the capacitance cause an alarm to be annunciated.

21 Claims, 4 Drawing Sheets

BODY DETECTOR

This application is a continuation of prior U.S. patent application Ser. No. 08/154,369, filed Nov. 18, 1993, now abandoned.

TECHNICAL FIELD OF THE INVENTION

The present invention relates generally to devices which detect the absence of a body. More specifically, the present invention relates to devices and methods for reliably determining when a device has been removed from a body.

BACKGROUND OF THE INVENTION

Increasingly, various monitoring and processing systems use body monitors. Body monitors are electronic devices which attach to a person, animal, or inanimate object, hereinafter referred to as a body, and perform some function with respect to that body. Numerous examples of body monitors are known. In connection with correctional facilities, prisoners may wear body monitors that, among other things, help correctional officers keep track of the prisoners' whereabouts. Likewise, in schools and day care centers students may wear body monitors. Hospital patients may wear body monitors to sense various patient parameters. Body monitors may be placed on various items of industrial equipment to sense operational parameters. In these and other situations, some form of control facility receives or otherwise processes information from the body monitors. For security reasons and/or for judging the validity of information being received from the body monitors, the control facility may need to verify that the body monitor is actually associated with the body being monitored.

Techniques are known for detecting the absence of a body. These known techniques may demonstrate acceptable reliability when body monitors are used in stable environments or with cooperative people. In situations where body monitors are used around uncooperative or otherwise mischief-prone people, or when the environment within which body monitors are used changes widely or is tamper-prone, reliably detecting the absence of a body is a difficult but important task.

One known body detector intended for use in connection with prisoner monitoring senses the capacitance of a capacitor that uses the body as a dielectric. An alarm is annunciated whenever the capacitance drops below a predetermined minimum capacitance. No alarm is declared so long as the capacitance remains above the minimum capacitance. The predetermined minimum capacitance is set at a level slightly greater than the value obtained when air is the only dielectric of the capacitor.

Failures in this and other alarm systems may result from either of two error conditions. One error condition is the "false alarm" and the other is the "false silence." The false alarm error occurs when the alarm system declares an alarm in response to a situation where no alarm should have been declared. The false silence error occurs when the alarm system fails to declare an alarm in response to a situation where an alarm should have been declared.

When a body detector uses the above-discussed technique for comparing a body capacitance against a minimum capacitance, the minimum capacitance may be set very low to minimize false alarms. However, the capacitances being detected for body monitoring are very low, and any minimum capacitance that significantly reduces false alarms is difficult to distinguish from stray capacitance. In other words, false alarm failures can be reduced only at the expense of false silence failures. Consequently, the system is unreliable because the system experiences either numerous false alarm errors or numerous false silence errors.

SUMMARY OF THE INVENTION

Accordingly, it is an advantage of the present invention that an improved body detector is provided.

Another advantage of the present invention is that a body detector is provided which improves reliability in detecting the absence of a body by reducing false alarm and false silence errors.

Another advantage is that the present invention adapts to the individual or body upon which it is installed and does not require individual adjustment for each body being monitored.

Another advantage is that the present invention does not require significant maintenance once installed.

Another advantage is that the present invention adapts to changing environmental conditions, such as horizontal or vertical position, work activity, sweat, weight gain or loss, and the like, which affect the snugness with which a body monitor attaches to a body.

The above and other advantages of the present invention are carried out in one form by a method for detecting the absence of a body. The method calls for measuring a first dielectric constant of a region within which the body should reside. A baseline value is generated in response to the first dielectric constant. A second dielectric constant of the region within which the body should reside is measured. The second dielectric constant measurement and the baseline value are compared to determine whether the second dielectric constant value falls within a first acceptable range about the first dielectric constant. If it does not, an alarm is given. If it does, then the second dielectric constant value becomes the new baseline value. Thus, the baseline value tracks slow changes in dielectric constant. Rapid changes that fall outside an acceptable range above or below the baseline value cause an alarm. However, an alarm is declared when the new dielectric constant value falls outside a second acceptable range.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
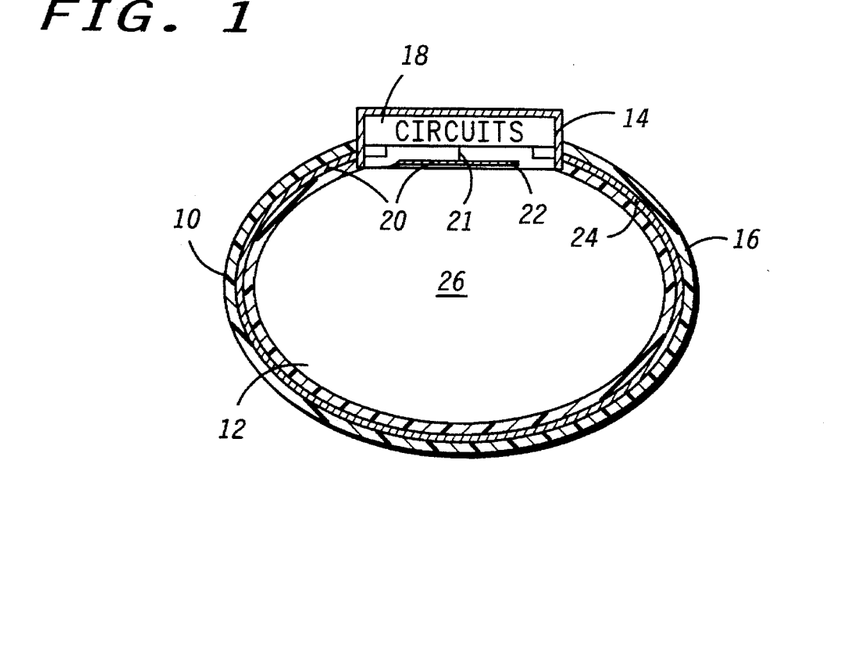
FIG. 1 shows a cross-sectional view of a body detector configured in accordance with the present invention and installed on a body.

FIG. 1 shows a body detector 10 configured as an item of wrist apparel. In other words, body detector 10 desirably encircles a person's arm 12 near the wrist, substantially as a watch does. Body detector 10 includes a circuit housing 14 that attaches on opposing sides thereof to a strap 16. Electronic circuits 18, discussed in greater detail below, reside within housing 14. Body detector 10 uses circuits 18 in performing the body detection function along with other monitoring functions which are not relevant to the present invention.

Body detector 10 additionally includes a body capacitor 20. Capacitor 20 includes a first electrode 22 and a second electrode 24. First electrode 22 is electrically coupled to electronic circuit 18 via connection 21, for example, although other types of electrical coupling may be employed. A back plate of housing 14 serves as electrode 22, and a material (e.g., conductive foil) embedded in strap 16 serves as electrode 24. Electrodes 22 and 24 couple to circuits 18 and serve as electrically separated plates for capacitor 20.

The capacitance exhibited by capacitor 20 depends on the dielectric constant of the material filling a region 26 which resides between electrodes 22 and 24. The dielectric constant of air is relatively low, allowing air to store very little electric energy as electrodes 22 and 24 become energized. Thus, when a significant amount of air resides in region 26, capacitor 20 exhibits a low capacitance, typically on the order of a few picoFarads. On the other hand, the dielectric constant of human and animal tissues is greater than that of air. Consequently, when arm 12 resides within region 26, a greater quantity of electric energy may be stored as electrodes 22 and 24 become energized, and capacitor 20 exhibits a higher capacitance.

However, the difference between dielectric constants of air in region 26 and human or animal tissue in region 26 need not be vastly different. A distinct difference results when body detector 10 is tightly installed on arm 12. But, a tight installation may be uncomfortable or otherwise bothersome for the wearer and may lead to many complaints. As the installation becomes looser, the overall dielectric constant approaches that of air, and the resulting capacitance exhibited by capacitor 20 decreases. At some point, only a very small difference in dielectric constant exists between a loosely-fitted body detector 10 with arm 12 occupying region 26 and a body detector 10 with only air occupying region 26.

Moreover, the tightness of body detector 10 does not remain constant over time, even under normal conditions. For example, the wearer may gain or lose weight, engage in strenuous physical activities or rest, hold arm 12 in a vertical or horizontal orientation, and the like. Any of these events will cause the tightness of body detector 10 on arm 12 to change. As tightness increases, the dielectric constant of region 26 and the capacitance exhibited by capacitor 20 increase. As tightness decreases, the dielectric constant of region 26 and the capacitance exhibited by capacitor 20 decrease.

On the other hand, even though the dielectric constant and capacitance change over time, under normal conditions they do not change rapidly. In other words, the normal and generally legitimate activities which lead to capacitance changes cause capacitance change to take place slowly. Illegitimate activities, such as removal of body detector 10 from arm 12, tend to take place more quickly.

Figure 2:
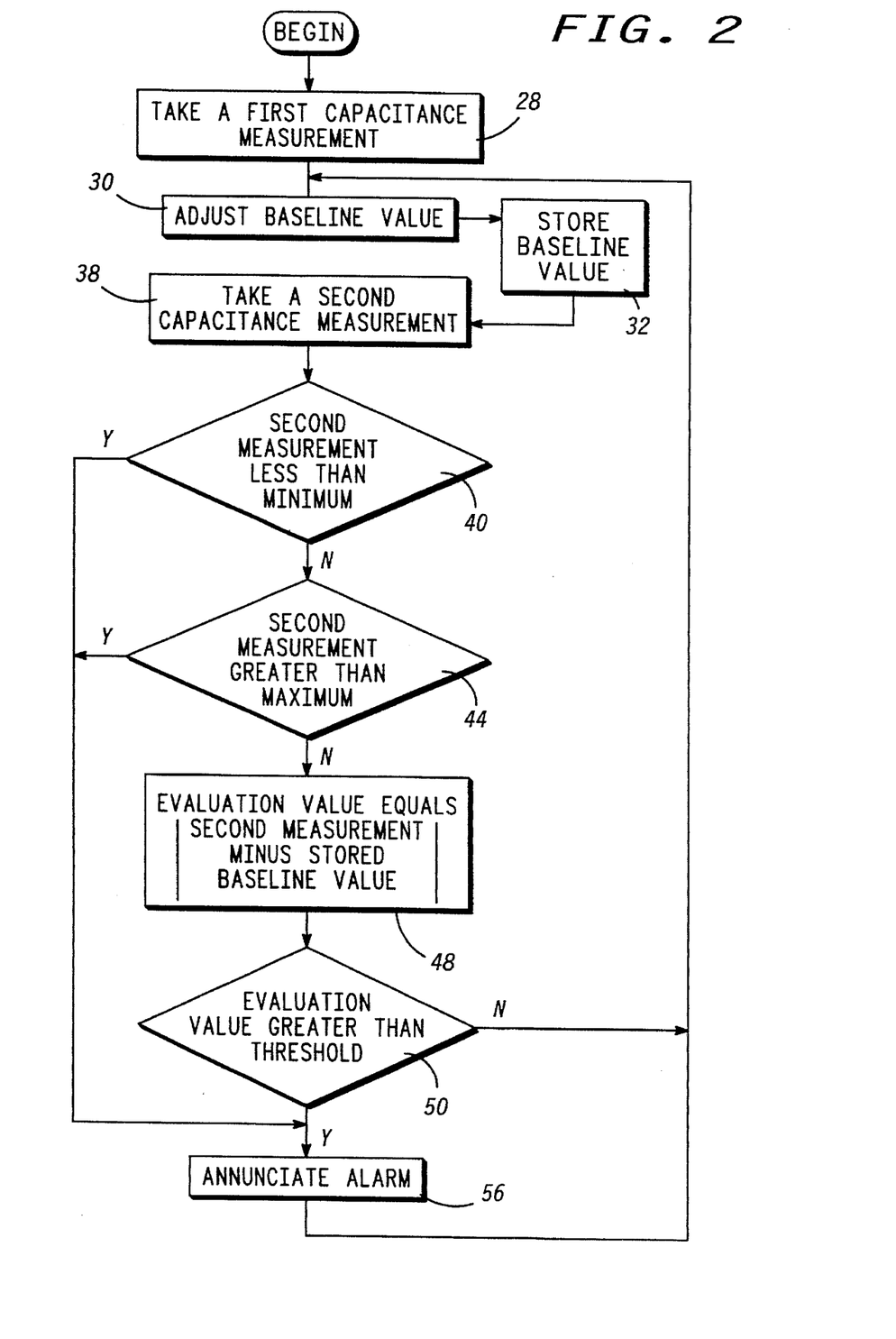
FIG. 2 is a flow chart of tasks performed by the body detector.

FIG. 2 is a flow chart of tasks performed by body detector 10 to detect the absence of a body, for example arm 12. During a task 28, body detector 10 takes a first measurement of capacitor 20 (FIG. 1). At task 28, arm 12 is assumed to be present in region 26. By taking a measurement, those skilled in the art will appreciate that task 28 need not measure the precise number of picoFarads exhibited by capacitor 20 during task 28. Rather, task 28 may obtain any value or signal which is related to the capacitance of capacitor 20 or to the dielectric constant of region 26.

After task 28, a task 30 adjusts a baseline or control value in response to the measurement taken in task 28. The adjusted baseline value is desirably then recorded in a storage element 32, such as a memory cell, register, latch, counter, or the like. The baseline value may, but need not, directly correspond to the capacitance of capacitor 20 during task 28. As discussed below, this baseline value is continually adjusted to slowly track changes in the capacitance of capacitor 20. In one embodiment, the baseline value may represent a moving average of several previous capacitance measurements.

Figure 3:
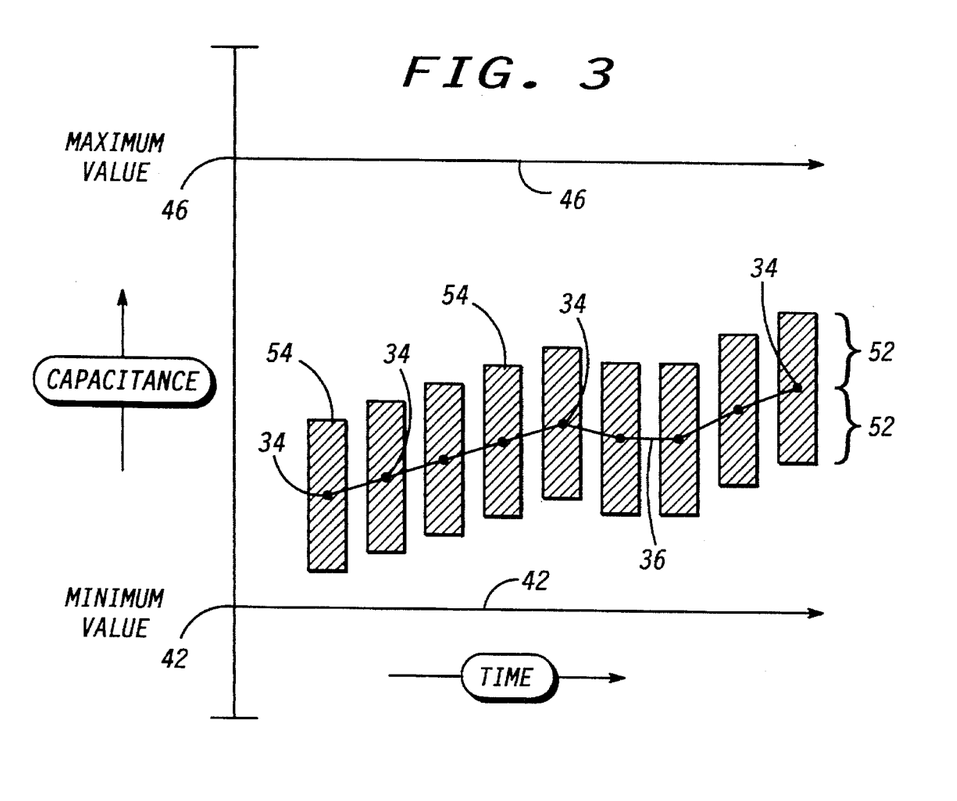
FIG. 3 is a sample timing chart depicting the body detector adapting to changes in capacitance.

FIG. 3 is a sample timing chart depicting values measured by body detector 10 as it adapts to changes in the capacitance of capacitor 20. Of course, those skilled in the art will appreciate that the capacitance of capacitor 20 need not change precisely as shown in FIG. 3, but that the capacitance may change in any manner. The baseline value obtained (task 30) and recorded (task 32) corresponds to baseline capacitance 34 at the point in time when task 30 is performed. A string of baseline capacitances 34 for different points in time defines a line 36.

Referring back to FIG. 2, after task 30 has adjusted the baseline value, a task 38 takes a second measurement of capacitor 20 and/or of the dielectric constant of region 26 (FIG. 1). After task 38, a query task 40 determines whether the second measurement indicates a capacitance that is less than an absolute minimum value 42 (FIG. 3). Absolute minimum value 42 is set to correspond to a very low capacitance and dielectric constant. In other words, the second measurement is unlikely to indicate a capacitance and dielectric constant less than absolute minimum value 42 unless arm 12 (FIG. 1) is actually not present in region 26. Preferably, minimum value 42 is set low so that false alarms are minimized. On the other hand, a chance exists that the capacitance exhibited by capacitor 20 may exceed minimum value 42 due to stray capacitances and the like, even though arm 12 is not in region 26. In other words, a comparison of measured capacitance against minimum value 42 by itself is unreliable because of an undesirably high chance of encountering a false silence error condition. Consequently, additional comparisons are performed, as discussed below.

When task 40 determines that the second measurement indicates a capacitance and dielectric constant greater than absolute minimum value 42 (FIG. 3), a query task 44 determines whether the second measurement indicates a capacitance and dielectric constant greater than an absolute maximum value 46. Absolute maximum value 46 is desirably set to correspond to an abnormally high capacitance and dielectric constant. In normal operation in accordance with legitimate activities, the capacitance of capacitor 20 should not exhibit such a great value. Thus, task 44 detects an abnormal situation where meddling, such as inserting a high-dielectric material in region 26 (FIG. 1), may be taking place.

So long as task 44 determines that the second measurement indicates a capacitance and dielectric constant less than absolute maximum value 46 (FIG. 3), body detector 10 performs a task 48. Task 48 obtains an evaluation value. The evaluation value equals the absolute value of the second measurement minus the baseline value obtained (task 30) and/or the stored baseline value (task 32). In other words, the evaluation value characterizes the difference, whether plus or minus, between the current measured capacitance and the baseline capacitance.

After task 48, a query task 50 determines whether the evaluation value obtained in task 48 is greater than a threshold value 52 (FIG. 3). Threshold value 52 corresponds to a capacitance tolerance range around baseline capacitance 34. So long as the current measured capacitance of capacitor 20 is within a range 54 of baseline capacitance 32, plus or minus threshold value 52, no alarm condition is declared.

Referring back to FIG. 2, when the current capacitance as indicated by the second measurement obtained above in task 38 is within range 54 (FIG. 3), program control returns to task 30 to update the control or baseline value retained in baseline storage element 32. The baseline value will be replaced with a new baseline or control value that is responsive to the current capacitance of capacitor 20. Desirably, this new baseline value does not precisely correspond to the current capacitance measured during the previous iteration of task 38. Rather, the new baseline value is slightly adjusted, such as by incrementing or decrementing, to more closely correspond to the current capacitance. That way, abrupt capacitance changes result in a measurement outside range 54 while slow capacitance changes remain within range 54 because range 54 adapts to accommodate slow changes (FIG. 3).

When task 50 determines that the evaluation value is outside range 54 (FIG. 3), an alarm condition is declared. This alarm condition results when the capacitance of capacitor 20 is less than baseline capacitance 34 by at least the amount of threshold value 52. In addition, this alarm condition results when the capacitance of capacitor 20 is greater than baseline capacitance 34 by at least the amount of threshold value 52. Use of the evaluation value causes the chances of a false silence error condition to be very small. An alarm condition may also be declared (task 40) when the second measurement (task 38) indicates a capacitance less than minimum value 42 or when (task 44) the second measurement (task 38) indicates a capacitance greater than maximum value 46.

When an alarm condition is declared, a task 56 annunciates the alarm. The alarm may be annunciated by sending a data message to a control facility (e.g., by electrical, radio, optical and/or acoustic signals), producing a beeping sound, or in any other manner known to those skilled in the art. After task 56, program control may return to task 30 or additional tasks (not shown) may be performed to further process the alarm.

Figure 4:
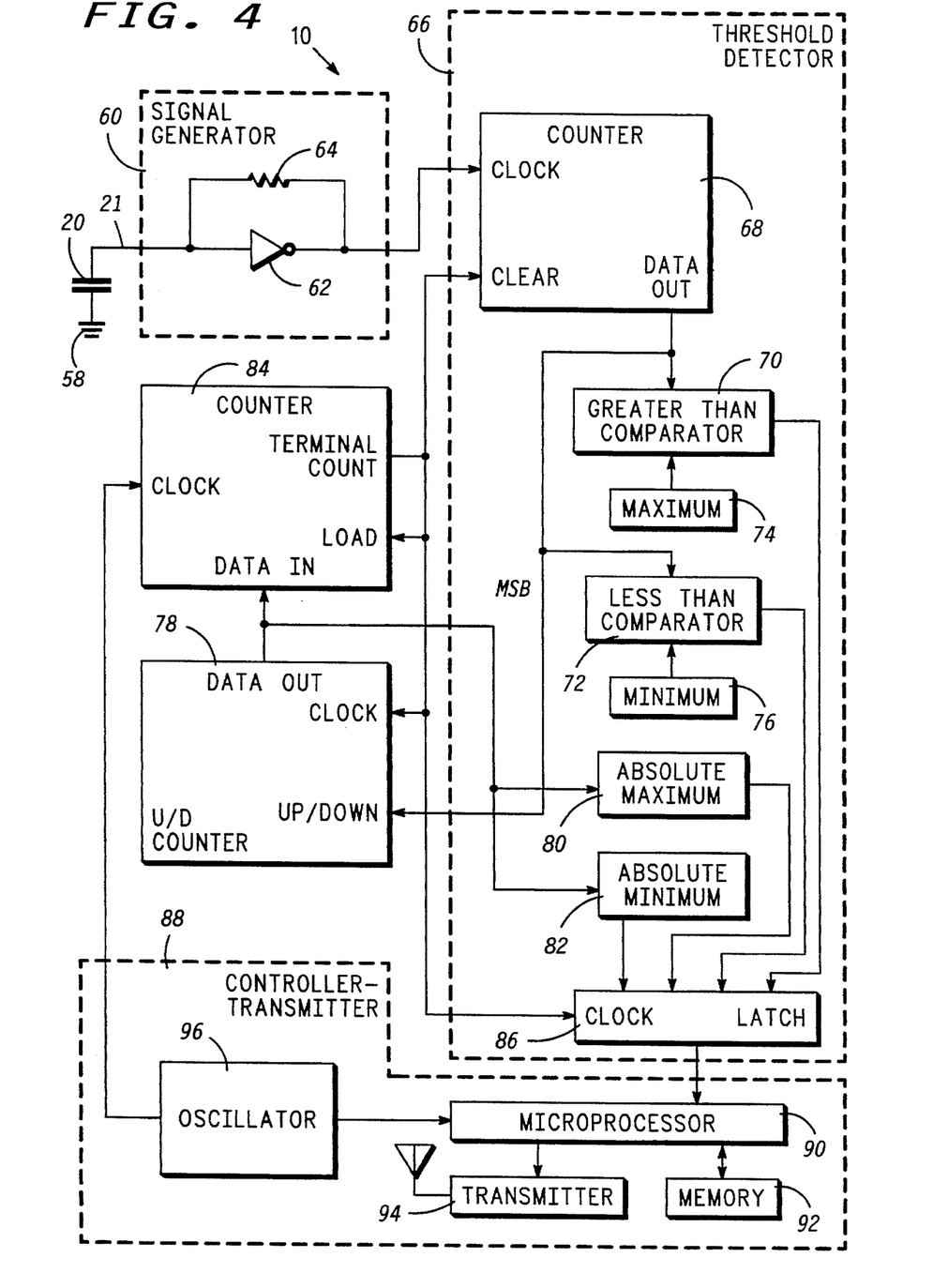
FIG. 4 is a block diagram of a first embodiment of the body detector.

Many different circuits may be devised to generally accomplish the functions depicted in FIGS. 2–3. For example, FIG. 4 is a block diagram of a first embodiment of body detector 10. Capacitor 20, discussed above in connection with FIGS. 1–3, couples between a ground node 58 and a signal generator 60. In particular, capacitor 20 is coupled via interconnection 21 to an input of an inverting circuit 62 of signal generator 60. A resistor 64 of signal generator 60 couples between an output of inverting circuit 62 and the input of inverting circuit 62. Thus, signal generator 60 forms an oscillator with capacitor 20. Signal generator 60 produces a signal which oscillates at a frequency that varies in response to the capacitance of capacitor 20 and the dielectric constant in region 26 (FIG. 1). Due to the low capacitance range for capacitor 20, this frequency may be on the order of a few kilohertz or several megaHertz.

The output of inverting circuit 62 and of signal generator 60 couples to an input of a threshold detector 66 at a clock input of a counter 68. A data output of counter 68 couples to a first data input of a "greater than" comparator 70 and to a first data input of a "less than" comparator 72. A circuit 74 provides a maximum value constant to a second data input of greater than comparator 70, and a circuit 76 provides a minimum value constant to a second data input of less than comparator 72.

The data output of counter 68 may express a count using many bits of data. A most significant bit of the data output from counter 68 couples to an up/down control input of an up/down (U/D) counter 78. Up/down counter 78 is not contained in threshold detector 66. Rather, up/down counter 78 serves as storage element 32 (FIG. 2) in this embodiment of the present invention. A data output of up/down counter 78 couples to inputs of logic circuits 80 and 82, which detect absolute maximum and absolute minimum values, respectively. FIG. 4 depicts circuits 80 and 82 as being in threshold detector 66. In addition, the data output of up/down counter 78 couples to a data input of a counter 84. A terminal count output of counter 84, such as an overflow or zero detection output, couples to a clear input of counter 68, to a load input of counter 84, and to a clock input of counter 78.

Outputs from greater than comparator 70, less than comparator 72, absolute maximum circuit 80, and absolute minimum circuit 82 couple to data inputs of a latch 86. In addition, the terminal count output of counter 84 couples to a clock input of latch 86. An output of latch 86 couples to a controller-transmitter circuit 88, and more particularly to a data input of a microprocessor 90. Controller-transmitter circuit 88 additionally includes a memory 92, which couples via a data and address bus to microprocessor 90. Transmitter 94 has an input which couples to a data output of microprocessor 90. An oscillator circuit 96 has a first output which couples to a clock input of microprocessor 90 and a second output which couples to a clock input of counter 84. Desirably, oscillator 96 generates substantially constant frequency signals for use by counter 84 and microprocessor 90. The frequency of the clock signal supplied to counter 84 may, for example, be roughly around the same order of magnitude as the range of frequencies produced by signal generator 60.

In operation, a control or baseline value is recorded in up/down counter 78. This baseline value represents a count that corresponds to baseline capacitance 34 (FIG. 3). This baseline count is loaded into counter 84 at the beginning of a count cycle and defines a duration or timing window for the count cycle. Counter 84 counts a constant frequency clock signal starting at an initial value loaded therein until a terminal count is achieved. While counter 84 is counting and has not yet achieved its terminal count, counter 68 in threshold detector 66 remains enabled and continues to count. Since counter 68 is enabled, it counts oscillations of the variable frequency signal produced by signal generator 60. In other words, counter 68 counts oscillations of this variable frequency signal for a duration determined in response to the control or baseline value recorded in up/down counter 78. When counter 84 reaches its terminal count, counter 68 becomes cleared so that the next counting cycle may start over again. The final count achieved by counter 68 will depend upon the capacitance of capacitor 20. Activation of the terminal count on counter 84 denotes the end of a counting cycle.

Generally speaking, counters 68, 78, and 84 couple together so that the final count achieved by counter 68 in each cycle is around the middle of the counting range for counter 68. For example, if counter 68 is an eight-bit counter capable of counting from 000 to 255, then counters 68, 78, and 84 cooperate to keep the count around the value 128. The most significant bit of data output from counter 68 transitions between set (binary 0) and reset (binary 1) states at values 127 and 128. If the count is less than this middle value, the up/down control on up/down counter 78 is controlled to increase the duration determined by counter 84 so that a larger count will be obtained in the next cycle. If the count is greater than or equal to this middle value, then the up/down control on up/down counter 78 is controlled to decrease the duration determined by counter 84 so that a smaller count will be obtained in the next cycle.

Before counter 84 leaves its terminal count, up/down counter 78 is incremented or decremented as indicated by the most significant bit from the data output of counter 68, and this new value is loaded into counter 84 as an initial value from which counting begins in counter 84 in the next cycle.

In addition, when counter 84 reaches its terminal count, the outputs of greater than comparator 70, less than comparator 72, absolute maximum logic circuit 80 and absolute minimum logic circuit 82 are recorded in latch 86. Since the final count attained by counter 68 in each cycle is held to a value roughly in the middle of the count range for counter 68, threshold value 52 (FIG. 3) may be defined as a constant offset from this middle value. In the preferred embodiment, maximum circuit 74 may desirably define a constant number equal to the middle value plus a predetermined number, for example thirty-two. Minimum circuit 76 may desirably define a constant number equal to the middle value minus a predetermined number, for example thirty-two. The output from greater than comparator 70 activates when counter 68 attains a final count value greater than the middle value plus a predetermined number. Less than comparator 72 activates when counter 68 attains a final count value less than the middle value minus a predetermined number. Together comparators 70 and 72 detect when a capacitance exhibited by capacitor 20 is outside range 54.

Absolute maximum and minimum circuits 80 and 82 monitor the baseline values recorded in up/down counter 78. When these baseline values get too far askew, which occurs when capacitances nearing absolute minimum and absolute maximum values 42 or 46 (FIG. 3) are being observed, circuits 80 and/or 82 activate.

Microprocessor 90, under the control of programming instructions stored in memory 92, reads the threshold detector outputs recorded in latch 86. If any alarming condition is indicated by threshold detector 66, microprocessor 90 annunciates an appropriate alarm. In the preferred embodiment, the alarm is annunciated by transmitting a data message to a control facility (not shown) via transmitter 94.

Figure 5:
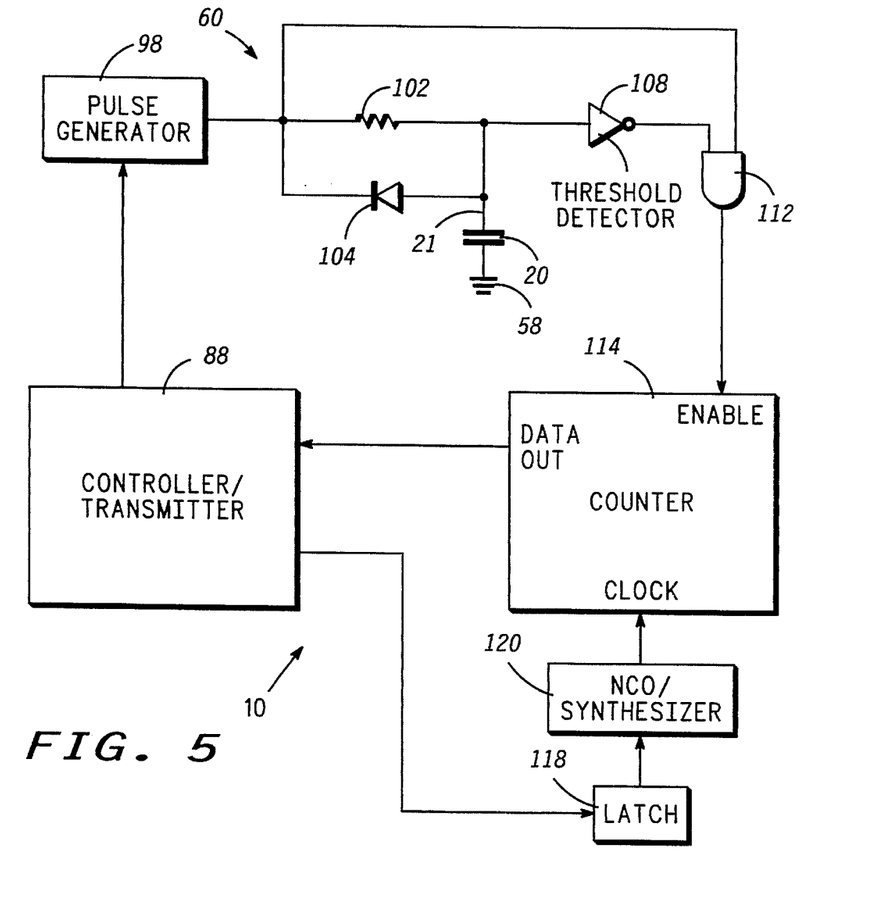
FIG. 5 is a block diagram of a second embodiment of the body detector.

FIG. 5 is a block diagram of a second embodiment of body detector 10. The first embodiment (FIG. 4 and associated text) counts a signal whose frequency varies in response to the capacitance of capacitor 20, and the counting takes place for a duration controlled by the baseline or control value. This second embodiment counts a substantially constant frequency signal for a duration which varies in response to the capacitance of capacitor 20. The frequency of the signal being counted is controlled by the baseline or control value.

The second embodiment includes controller-transmitter 88 (FIG. 5) having substantially the same configuration as discussed above in connection with FIG. 4. A clock or data output bit from controller-transmitter 88 couples to an input of a pulse generator 98. Pulse generator 98 generates pulses 100 (top trace, FIG. 6). Several hundred microseconds or more may transpire between each pulse 100, and pulses 100 may be initiated under the programming control of controller-transmitter 88. A resistor 102 couples between the output of pulse generator 98 and a first node of capacitor 20. An anode of a diode 104 also couples to the first node of capacitor 20, and a cathode of diode 104 couples to the output of pulse generator 98. A second node of capacitor 20 couples to ground node 58.

Figure 6:
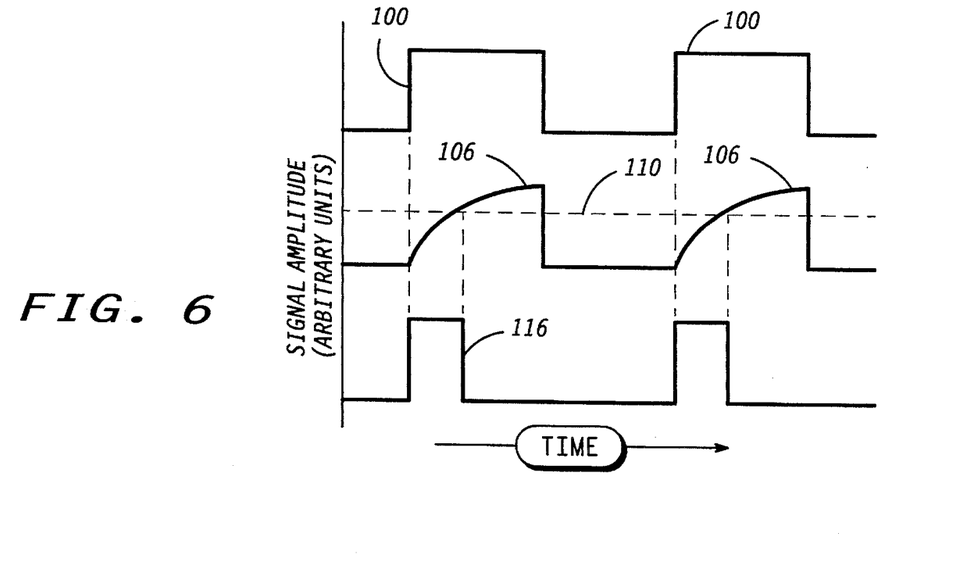
FIG. 6 is a timing diagram depicting the operation of the second embodiment of the body detector.

Referring to FIGS. 5–6, the first node of capacitor 20 generates pulses 106 (middle trace, FIG. 6) in response to pulses 100. While each pulse 100 is active, or at a high level in accordance with the polarities illustrated in FIGS. 5–6, capacitor 20 slowly accumulates a charge through resistor 102. The speed at which the charge accumulates varies in response to the capacitance of capacitor 20. Greater capacitance leads to a slower charging time and less capacitance leads to a faster charging time. When pulse 100 deactivates, most of this charge is quickly dumped through diode 104. Accordingly, pulse generator 98 in combination with resistor 102 form signal generator 60 (FIG. 4) for this second embodiment. Signal generator 60 couples to capacitor 20 to produce a signal that exhibits a parameter, such as charging time, which is responsive to the capacitance of capacitor 20.

The first node of capacitor 20 couples to an input of a threshold detector 108. Threshold detector 108 represents an inverting analog comparator or Schmitt trigger invertor circuit whose output switches states when its input voltage reaches a predetermined threshold level 110, depicted by a dotted line (middle trace, FIG. 6). Desirably, threshold level 110 is set so that an average capacitance exhibited by capacitor 20 causes a pulse 106 to charge to threshold level 110 at roughly the center of the duration for pulse 100. Thus, as the capacitance of capacitor 20 decreases, pulses 106 charge to threshold level 110 faster, and as the capacitance of capacitor 20 increases, pulses 106 charge to threshold level 110 more slowly.

The output of threshold detector 108 and the output of pulse generator 98 couple to inputs of an AND gate 112. An output of AND gate 112 couples to an enable input of a counter 114. The output of AND gate 112 produces a signal 116, shown in the bottom trace of FIG. 6. Signal 116 initially activates when a pulse 100 activates, and remains active until pulse 106 charges to threshold level 110. While signal 116 remains active, counter 114 is free to count. While signal 116 is inactive, counter 114 is prevented from counting.

A data output of controller-transmitter 88 couples to a latch 118. An output of latch 118 couples to a control input of a numerically controlled oscillator (NCO) or frequency synthesizer 120. A clock output of NCO or synthesizer 120 couples to a clock input of counter 114, and a data output of counter 114 couples to a data input of controller-transmitter 88.

Data generated by controller-transmitter 88 are stored in latch 118. These data program the frequency at which NCO or synthesizer 120 oscillates, and counter 114 counts these oscillations when it is enabled to do so by signal 116.

The count provided at the data output of counter 114 corresponds to the capacitance of capacitor 20 and to the dielectric constant of region 26 (FIG. 1). Controller-transmitter 88 uses this count to form a baseline or control value which is stored in latch 118. Thus, latch 118 serves as storage element 32 (FIG. 2) in this second embodiment. The baseline value programs the oscillation frequency of NCO or synthesizer 120, and this frequency is preferably controlled so that the count at the data output of counter 114 approaches its middle value, similar to counter 68 (FIG. 4 and associated text). In this second embodiment, comparisons for determining whether the count supplied by counter 114 is outside of range 54 (see FIG. 3), are performed by controller-transmitter 88 under program control. Likewise, comparisons for determining whether the baseline value programmed in latch 118 indicates current capacitance greater than absolute maximum value 46 (FIG. 3) or less than absolute minimum value 42 are performed by controller-transmitter 88.

In a variation (not shown) of this second embodiment, a constant frequency oscillator may be substituted for NCO or synthesizer 120, while the maintenance of the baseline value along with comparisons for range 54 and values 42 and 46 (FIG. 3) are all performed under software control in controller-transmitter 88.

In summary, the present invention provides an improved body detector. The reliability demonstrated in detecting the absence of a body is improved because a technique for adapting the definition of an acceptable capacitance range to past capacitance measurements is used to reduce false silence and false alarm error conditions. A body detector configured in accordance with the present invention adapts to the body (e.g., individual) upon which it is installed and does not require individual adjustment for each body being monitored. Moreover, no significant maintenance is required once it is installed. The present invention adapts to changing environmental conditions, such as horizontal or vertical position, work activity, sweat, weight gain or loss, and the like, which affect the snugness with which a body monitor attaches to a body.

The present invention has been described above with reference to preferred embodiments. However, those skilled in the art will recognize that changes and modifications may be made in these preferred embodiments without departing from the scope of the present invention. For example, the present invention is not limited to use as an item of wrist apparel, but may encircle a leg or other portion of an animate or inanimate body. Likewise, those skilled in the art will appreciate that numerous changes in particular components and in the order of various tasks may be made without departing from the scope of the present invention. These and other changes and modifications which are obvious to those skilled in the art are intended to be included within the scope of the present invention.

What is claimed is:

1. A method for detecting the absence of a body, said method comprising steps of:

measuring a first dielectric constant of a region within which said body should reside;

generating a baseline value in response to said first dielectric constant, said baseline value corresponding to a baseline dielectric constant;

retaining said baseline value in a memory;

measuring a second dielectric constant of said region within which said body should reside, wherein said measuring steps are carried out by a self-contained, portable unit comprising an item of wrist apparel having a circuit housing and a strap and said self-contained, portable unit comprises a capacitor including a first electrode disposed on said housing and a second electrode disposed on said strap; and evaluating said second dielectric constant measurement and said baseline value from said memory to determine whether said second dielectric constant is less than said baseline dielectric constant; wherein said measuring steps comprise steps of:

producing a signal exhibiting a parameter responsive to a current capacitance of said capacitor by an oscillator coupled to said capacitor, said signal oscillating at a frequency that varies in response to said current capacitance, said current capacitance corresponding to said second dielectric constant; and generating a clocking signal by a clocking circuit, wherein a first counter is coupled to said clocking circuit and to said oscillator and wherein said first counter is configured to count said clock signal for a duration controlled by said signal produced by said oscillator to provide a control value; and wherein said retaining step includes a step of recording said control value in a memory, said memory comprising a second counter having a clock input coupled to said clocking circuit, a terminal count output and a load input, said load input coupled to said terminal count output; and wherein said evaluating step includes steps of:

determining, by a threshold detector coupled to said oscillator and said memory, when:

(i) said current capacitance is less than said baseline value by at least a first predetermined threshold value;

(ii) said current capacitance exhibited by said capacitor is greater than said baseline value by at least a second predetermined threshold value;

(iii) said current capacitance is less than a predetermined minimum capacitance; and (iv) said current capacitance is greater than a predetermined maximum capacitance, said threshold detector being configured to count oscillations of said signal for a duration determined in response to said control value;

replacing said control value recorded in said memory with a new control value via an up/down counter having a clock input coupled to said terminal count output, an up/down input coupled to a most significant bit of a data output of said first counter and having a data output coupled to a data input of said second counter; and communicating an alarm when said current capacitance is less than said baseline value.

2. A method as claimed in claim 1 additionally comprising steps of:

detecting dielectric constant changes in said region; and adjusting said baseline value in response to said dielectric constant changes.

3. A method as claimed in claim 1 wherein said evaluating step comprises a step of determining whether said second dielectric constant is less than said baseline dielectric constant by at least a predetermined threshold value.

4. A method as claimed in claim 1 additionally comprising a step of determining whether said second dielectric constant is greater than said baseline dielectric constant by at least a predetermined threshold value.

5. A method as claimed in claim 1 additionally comprising a step of determining whether said second dielectric constant is less than a predetermined minimum dielectric constant value.

6. A method as claimed in claim 1 additionally comprising a step of determining whether said second dielectric constant is greater than a predetermined maximum dielectric constant value.

7. A method as claimed in claim 1 additionally comprising a step of annunciating an alarm when said evaluating step determines that said second dielectric constant is less than said baseline dielectric constant.

8. A method for adaptively determining absence of a body, said method comprising steps of:

configuring a capacitor so that said body, if present, forms at least a portion of a dielectric for said capacitor, wherein said capacitor comprises a self-contained, portable unit comprising an item of wrist apparel having a circuit housing and a strap, including a first electrode disposed on said housing and a second electrode disposed on said strap;

establishing a control value corresponding to a baseline capacitance;

retaining said control value in a memory;

measuring a current capacitance exhibited by said capacitor;

determining if said current capacitance exhibited by said capacitor is less than said baseline capacitance by at least a predetermined threshold value; and updating said control value with a new control value that is responsive to said current capacitance exhibited by said capacitor;

producing a signal exhibiting a parameter responsive to said current capacitance of said capacitor by an oscillator coupled to said capacitor, said signal oscillating at a frequency that varies in response to said current capacitance;

generating a clocking signal by a clocking circuit, wherein a first counter is coupled to said clocking circuit and to said oscillator and wherein said first counter is configured to count said clock signal for a duration controlled by said signal produced by said oscillator;

recording said control value in said memory, said memory comprising a second counter having a clock input coupled to said clocking circuit, a terminal count output and a load input, said load input coupled to said terminal count output;

determining, by a threshold detector coupled to said oscillator and said memory, when:

(i) said current capacitance is less than said baseline capacitance by at least a first predetermined threshold value;

(ii) said current capacitance exhibited by said capacitor is greater than said baseline capacitance by at least a second predetermined threshold value;

(iii) said current capacitance is less than a predetermined minimum capacitance; and (iv) said current capacitance is greater than a predetermined maximum capacitance, said threshold detector being configured to count oscillations of said signal for a duration determined in response to said control value;

replacing said control value recorded in said memory with a new control value via an up/down counter having a clock input coupled to said terminal count output, an up/down input coupled to a most significant bit of a data output of said first counter and having a data output coupled to a data input of said second counter; and communicating an alarm when said current capacitance is less than said baseline capacitance.

9. A method as claimed in claim 8 additionally comprising a step of determining whether said current capacitance is greater than said baseline capacitance by at least a predetermined threshold value.

10. A method as claimed in claim 8 additionally comprising a step of determining whether said current capacitance is less than a predetermined minimum capacitance.

11. A method as claimed in claim 8 additionally comprising a step of determining whether said current capacitance is greater than a predetermined maximum capacitance.

12. A method as claimed in claim 8 additionally comprising a step of annunciating an alarm when said determining step determines that said current capacitance is less than said baseline capacitance.

13. An apparatus for adaptively detecting absence of a body, said apparatus including a clocking circuit for generating a clocking signal, said apparatus comprising:

a capacitor exhibiting an associated current capacitance, said capacitor being a self-contained, portable unit comprising an item of wrist apparel having a circuit housing and a strap, including a first electrode disposed on said housing and a second electrode disposed on said strap, said capacitor configured so that said body, if present, forms at least a portion of a dielectric for said capacitor;

an oscillator, coupled to said capacitor, for producing a signal exhibiting a parameter responsive to said current capacitance of said capacitor;

a storage element for recording a control value that corresponds to a baseline capacitance;

means, coupled to said storage element, for replacing said control value recorded in said storage element with a new control value;

a threshold detector, coupled to said oscillator and said storage element, for determining when said current capacitance is less than said baseline capacitance by at least a predetermined threshold value, wherein said threshold detector comprises:

a first counter configured to count oscillations of said signal for a duration determined in response to said control value, said threshold detector for determining when:

(i) said current capacitance is less than said baseline capacitance by at least a first predetermined threshold value;

(ii) said current capacitance exhibited by said capacitor is greater than said baseline capacitance by at least a second predetermined threshold value;

(iii) said current capacitance is less than a predetermined minimum capacitance; and (iv) said current capacitance is greater than a predetermined maximum capacitance; and wherein said storage element comprises:

a second counter having a clock input coupled to said clocking circuit, a terminal count output and a load input, said load input coupled to said terminal count output; and wherein said replacing means comprises an up/down counter having a clock input coupled to said terminal count output, an up/down input coupled to a most significant bit of a data output of said first counter and having a data output coupled to a data input of said second counter.

14. An apparatus as claimed in claim 13 wherein said replacing means additionally couples to said threshold detector and is configured so that said new control value is responsive to said current capacitance exhibited by said capacitor.

15. An apparatus as claimed in claim 13 wherein said oscillator comprises an oscillator configured so that said signal oscillates at a frequency that varies in response to said current capacitance.

16. An apparatus as claimed in claim 15 wherein said threshold detector comprises a counter configured to count oscillations of said signal for a duration determined in response to said control value.

17. An apparatus as claimed in claim 13 wherein said oscillator comprises:
   a pulse generator;
   a resistor coupled in series between said pulse generator and said capacitor; and
   a second threshold detector having an input coupled to said capacitor, said second threshold detector being configured to activate when a charge stored in said capacitor exhibits a predetermined level.

18. An apparatus as claimed in claim 13, wherein said threshold detector comprises a counter coupled to said clocking circuit and to said oscillator and wherein said counter is configured to count said clock signal for a duration controlled by said signal produced by said oscillator.

19. An apparatus as claimed in claim 13 additionally comprising means, coupled to said threshold detector, for communicating an alarm when said current capacitance is less than said baseline capacitance.

20. An apparatus for adaptively detecting absence of a body, said apparatus comprising:
   a capacitor exhibiting an associated current capacitance, said capacitor being a self-contained, portable unit comprising an item of wrist apparel having a circuit housing and a strap, including a first electrode disposed on said housing and a second electrode disposed on said strap, said capacitor configured so that said body, if present, forms at least a portion of a dielectric for said capacitor;
   an oscillator, coupled to said capacitor, for producing a signal exhibiting a parameter responsive to said current capacitance of said capacitor, said oscillator configured so that said signal oscillates at a frequency that varies in response to said current capacitance;
   a clocking circuit for providing a clocking signal;
   a storage element for recording a control value that corresponds to a baseline capacitance, wherein said storage element comprises a second counter having a clock input coupled to said clocking circuit, a terminal count output and a load input, said load input coupled to said terminal count output;
   a threshold detector, coupled to said oscillator and said storage element, said threshold detector for determining when:
      (i) said current capacitance is less than said baseline capacitance by at least a first predetermined threshold value;
      (ii) said current capacitance exhibited by said capacitor is greater than said baseline capacitance by at least a second predetermined threshold value;
      (iii) said current capacitance is less than a predetermined minimum capacitance; and
      (iv) said current capacitance is greater than a predetermined maximum capacitance,
   said threshold detector comprising a first counter configured to count oscillations of said signal for a duration determined in response to said control value;
   means, coupled to said storage element, for replacing said control value recorded in said storage element with a new control value, said replacing means coupled to said threshold detector and configured so that said new control value is responsive to said current capacitance exhibited by said capacitor, wherein said replacing means comprises an up/down counter having a clock input coupled to said terminal count output, an up/down input coupled to a most significant bit of a data output of said first counter and having a data output coupled to a data input of said second counter;
   a clocking circuit for generating a clocking signal, wherein said first counter is coupled to said clocking circuit and to said oscillator and wherein said first counter is configured to count said clock signal for a duration controlled by said signal produced by said oscillator; and
   means, coupled to said threshold detector, for communicating an alarm when said current capacitance is less than said baseline capacitance.

21. An apparatus as claimed in claim 20 wherein said oscillator comprises:
   a pulse generator;
   a resistor coupled in series between said pulse generator and said capacitor; and
   a second threshold detector having an input coupled to said capacitor, said second threshold detector being configured to activate when a charge stored in said capacitor exhibits a predetermined level.

\* \* \* \* \*